US 8,514,976 B2

(12) United States Patent
Kim et al.

(10) Patent No.: US 8,514,976 B2
(45) Date of Patent: Aug. 20, 2013

(54) METHOD AND APPARATUS FOR CODING AND INTERLEAVING FOR VERY HIGH THROUGHPUT WIRELESS COMMUNICATIONS

(75) Inventors: Youhan Kim, Albany, CA (US); Ning Zhang, Saratoga, CA (US); Chin-Hung Chen, Tainan (TW)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/245,776

(22) Filed: Sep. 26, 2011

(65) Prior Publication Data

US 2012/0076234 A1    Mar. 29, 2012

Related U.S. Application Data

(60) Provisional application No. 61/386,827, filed on Sep. 27, 2010.

(51) Int. Cl.
*H04L 27/00*        (2006.01)
(52) U.S. Cl.
USPC ........... 375/299; 375/260; 375/262; 375/265; 375/267; 375/340; 375/343; 375/346; 375/347; 375/350
(58) Field of Classification Search
USPC .................. 375/295, 299, 260, 262, 265, 267, 375/340, 343, 346, 347, 350; 370/203, 204, 370/205, 208, 209, 210; 327/291; 332/106; 341/20, 173
See application file for complete search history.

(56) References Cited

U.S. PATENT DOCUMENTS

| 7,098,821 | B2 | 8/2006 | Husted et al. |
| 7,729,447 | B2 | 6/2010 | Horng et al. |
| 8,184,726 | B2 * | 5/2012 | Hsiao et al. ................ 375/260 |
| 8,199,843 | B2 | 6/2012 | Kwak et al. |
| 2007/0183533 | A1 | 8/2007 | Schmidl et al. |

OTHER PUBLICATIONS

International Search Report and Written Opinion—PCT/US2011/053465—ISA/EPO—Jan. 18, 2012.

* cited by examiner

*Primary Examiner* — Dhaval Patel
(74) *Attorney, Agent, or Firm* — Bever, Hoffman & Harms, LLP

(57) ABSTRACT

A wireless transmitter can include a plurality of bandwidth modules, each bandwidth module processing data based on a predetermined frequency band. In one embodiment, such a wireless transmitter can include encoding components for receiving transmit data and generating encoded data. A multiple-input multiple-output (MIMO) stream parser can receive the encoded data and generate a plurality of MIMO streams. A first module parser coupled to a first MIMO stream can generate a first plurality of partial MIMO streams. A first bandwidth module can include a first interleaver that interleaves bits of the first partial MIMO stream and generates first interleaved data. A second bandwidth module can include a second interleaver that interleaves bits of the second partial MIMO stream and generates second interleaved data. A first inverse fast Fourier transform (IFFT) unit can combine and process the first and second interleaved data and generate a first transmission MIMO stream.

29 Claims, 9 Drawing Sheets

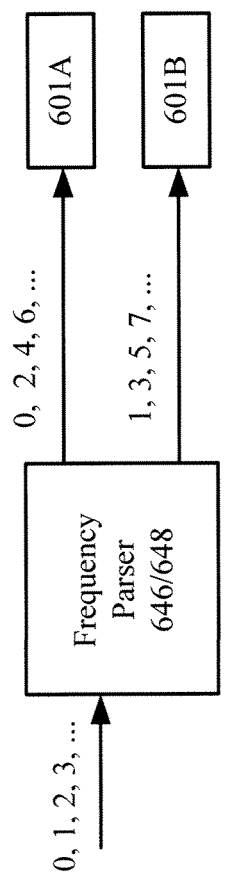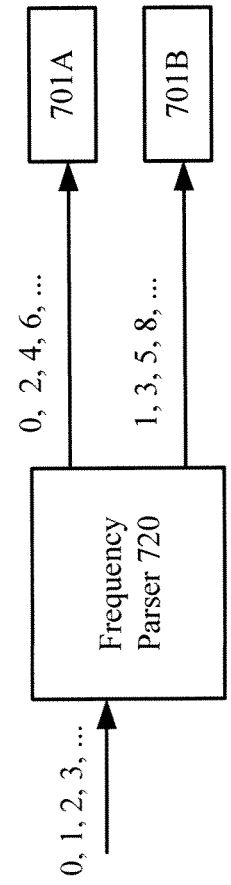

METHOD AND APPARATUS FOR CODING AND INTERLEAVING FOR VERY HIGH THROUGHPUT WIRELESS COMMUNICATIONS

RELATED APPLICATIONS

This application claims priority of U.S. Provisional Patent Application 61/386,827, entitled "Method And Apparatus For Coding And Interleaving For Very High Throughput Wireless Communications" filed Sep. 27, 2010.

BACKGROUND OF THE INVENTION

1. Field of the Invention

This invention relates generally to communication systems and more particularly to wireless networks.

2. Related Art

Digital data can be transmitted over analog channels or wirelessly for communication to users. The channel over which data is communicated has several inherent difficulties. Corruption of transmitted data occurs additively or multiplicatively due to noise and other physical phenomena. A goal of the transmission and reception system is to communicate reliably and ably, despite these difficulties.

In order to communicate digital data over an analog channel, the data is modulated using, among other techniques, a form of pulse amplitude modulation. In pulse amplitude modulation (PAM), the amplitude of a pulsed carrier changes based on the signal information. The signal or useful information, therefore, is carried in the amplitude of the pulses of the carrier. A form of pulse amplitude modulate is quadrature amplitude modulation (QAM). QAM is an improvement over a traditional PAM, in that QAM increases the amount of data that can be transmitted within a particular channel. QAM is a form of PAM in which a plurality of bits are transmitted in a constellation, that can contain, for example 16 or 32 points. Typically, in a QAM, the signal changes both in the amplitude dimension and the phase dimension.

A typical communication system over an analog channel or wireless channel involves a receiver and a transmitter. In order to handle the channel uncertainty when the information is passed over the channel, the useful information is encoded with redundant bits to correct single and multiple bit errors as the information is received over the uncertain channel. At the transmitter, the encoding for forward error correction (FEC) is performed. In order to reduce the probability of block errors from occurring, the encoded information is passed over an interleaver, so that contiguous encoded bits are not transmitted adjacent to each other. The symbols are then mapped over a carrier frequency in a band through a form of frequency interleaving before being processed for transmission. On reception, a reverse process is undertaken: the received data is de-interleaved and then decoded. The decoded data is processed for error detection and check, and if necessary, a correction of data.

Typically, for a certain bandwidth and network architecture, a transmit data path exists as a hardware implementation of all of the components. These components perform the functions of encoding, stream parsing, QAM mapping, OFDM modulation and preamble processing before passing the processed data to an RF transceiver connected to an antenna. On the receive side, an antenna connected to an RF transceiver receives the information and subsequent components perform preamble processing, OFDM demodulation, QAM de-mapping, bit de-interleaving and decoding. Both receive and transmit data paths have a certain data width and operate at a certain clock speed to support a certain bandwidth.

With the increase in the demands of the interne, all sections of the network, including wireless LAN are going through a bandwidth explosion, necessitating an upgrade of the specifications to a higher bandwidth and with better and more reliable performance. For an equipment vendor in the networking area and particularly in the wireless LAN space, it is imperative to keep abreast with architectural changes driven by growth in demand for the bandwidth and develop products with reduced time to market and with competitive feature sets. For the vendors, it is increasingly difficult to spin a new generation of product architecture with each and every change in the specification.

In the evolutionary development of the 802.11 standard, the latest standard is referred to as 802.11ac for "very high throughput" (VHT). VHT transfers data in a 5 GHz band. Embodiments include RF signal bandwidths of up to 160 MHz and data rates of up to 6.933 Gbps. In one embodiment, maximum bandwidths can be 80 MHz or 160 MHz. More efficient signal processing schemes and data path design techniques are being deployed to reduce noise and improve the signal to noise ratio along with scaling the bandwidths to double or quadruple the data transfer rates.

Where a next generation network architecture with higher bandwidth is to be supported, several trade-off points are available to the system designer. The system designer performs under the constraints of managing recurring and non-recurring engineering costs, reduced time to market and faster adaptability to changing standards. There is no compromise however, on key aspects of supporting the higher specified bandwidth and maintaining backwards compatibility to be able to work with equipment that has not yet been upgraded. The system designer's work invariably involves a tradeoff between using the components designed for a previous generation and running it at same or higher speeds or redesigning the entire data path. Redesigning the entire data path presents substantial risks to time to market. The new design has to be functionally verified and confirmed that it complies with a set of specifications for function, reliability, mechanics and environment, among others. Running older designs at higher speeds is not always feasible as the design has been targeted to a certain clock speed for a certain target technology.

While some clock speedup is possible by way of upgrade of technology, it is not of the order of the scale by which the bandwidths are expanding from generation to generation. Further, where the design involves analog components along with digital components, as in a silicon implementation of an RF radio receiver and transmitter, the linear scaling of technology is not possible, as it is for a purely digital design. Accordingly, traditional solutions do not present optimal solutions for the system designer.

SUMMARY OF THE INVENTION

Various embodiments of the invention can provide a solution to the challenges inherent in the design and implementation of wireless devices.

A wireless transmitter can include a plurality of bandwidth modules, each bandwidth module processing data based on a predetermined frequency band. In one embodiment, such a wireless transmitter can include encoding components for receiving transmit data and generating encoded data. A multiple-input multiple-output (MIMO) stream parser can receive the encoded data and generate a plurality of MIMO streams. A first module parser coupled to a first MIMO stream can generate a first plurality of partial MIMO streams. A first bandwidth module can include a first interleaver that interleaves bits of the first partial MIMO stream and generates first interleaved data. A second bandwidth module can include a second interleaver that interleaves bits of the second partial MIMO stream and generates second interleaved data. A first inverse fast Fourier transform (IFFT) unit can combine and process the first and second interleaved data and generate a first transmission MIMO stream.

The first and second partial MIMO streams can be processed on adjacent or non-adjacent frequency bands. The first and second interleavers can advantageously interleave the bits of the first and second partial MIMO streams, respectively, over different frequency bands. In one embodiment, the first module parser can allocate even bits of the MIMO stream to the first partial MIMO stream (for the first bandwidth module) and odd bits of the MIMO stream to the second partial MIMO stream (for the second bandwidth module).

The wireless transmitter can further include a second module parser coupled to a second MIMO stream from the MIMO stream parser. The second module parser can generate a second plurality of partial MIMO streams. Notably, the first and second module parsers provide a same allocation of bits to the first and second bandwidth modules. The first bandwidth module can include a third interleaver that interleaves bits of a third partial MIMO stream (from the second plurality of partial MIMO streams) and generates third interleaved data. The second bandwidth module can include a fourth interleaver that interleaves bits of a fourth partial MIMO stream (also from the second plurality of partial MIMO streams) and generates fourth interleaved data. A second IFFT unit, coupled to the third and fourth bandwidth modules, can combine and process the third and fourth interleaved data to generate a second transmission MIMO stream.

In one embodiment, the first and second IFFT units each provide for a 160 MHz bandwidth. The wireless transmitter can further include first and second spatial mappers in the first and second bandwidth modules, respectively. Each of the first and second spatial mappers can receive modulated, interleaved data and map tones to the first and second IFFTs. In one embodiment, each of the first and second spatial mappers performs mapping over 234 tones.

Another wireless transmitter described herein includes a module parser receiving the transmit data and producing first and second data streams from the transmit data. A first bandwidth module, coupled to the first data stream, can include first encoding components, a first MIMO stream parser, and a first interleaver. The first encoding component can receive the first data stream and generate first encoded data. The first MIMO stream parser can receive the first encoded data and generate a first plurality of MIMO streams. The first interleaver can interleave bits of one of the first plurality of MIMO streams. A second bandwidth module, coupled to the second data stream, can include second encoding components, a second MIMO stream parser, and a second interleaver. The second encoding component can receive the second data stream and generate second encoded data. The second MIMO stream parser can receive the second encoded data and generate a second plurality of MIMO streams. The second interleaver can interleave bits of one of the second plurality of MIMO streams. The wireless transmitter can further include first and second IFFT units coupled to the first and second bandwidth modules for processing interleaved data for transmission.

The first and second data streams are processed on adjacent or non-adjacent frequency bands. In either embodiment, the first and second interleavers interleave bits of the first and second data streams over different frequency bands. In one embodiment, the module parser can allocate even bits of the transmit data to the first data stream and odd bits of the transmit data to the second data stream. The wireless transmitter can further include first and second spatial mappers in the first and second bandwidth modules, respectively. Each of the first and second spatial mappers can receive modulated, interleaved data and map tones to the first and second IFFTs.

Another wireless transmitter described herein includes first and second bandwidth modules and first and second IFFT units. Each of the bandwidth modules can be configured to: receive a plurality of partial MIMO streams including encoded transmit data, interleave bits of the plurality of partial MIMO streams to generate interleaved data, modulate the interleaved data, and perform spatial mapping on the interleaved data based on predetermined tones to generate mapped data. The first and second bandwidth modules can process the partial MIMO streams on adjacent or non-adjacent frequency bands. In one embodiment, the spatial mapping uses 234 tones for the predetermined tones. The first and second IFFT units, which are coupled to the first and second bandwidth modules, can transform the mapped data for transmission.

The wireless transmitter can further include a MIMO stream parser and a plurality of module parsers. The MIMO stream parser can receive a plurality of encoded data streams and generate a plurality of MIMO streams. Each module parser can receive a MIMO stream and allocate bits of the MIMO stream to the first and second bandwidth modules based on a predetermined allocation scheme. In one embodiment, the predetermined allocation scheme allocates even bits to the first bandwidth module and odd bits to the second bandwidth module.

Another wireless transmitter described herein includes first and second bandwidth modules and first and second IFFT units in a different configuration. Specifically, each of the first and second bandwidth modules can be configured to: encode received transmit data to generate encoded data, parse the encoded data into first and second MIMO streams, interleave bits from each of the first and second MIMO streams to generate interleaved bits, modulate the interleaved bits to generate modulated data, and perform spatial mapping on the modulated data based on predetermined tones (e.g. 234) to generate mapped data. The wireless transmitter can further include first and second IFFT units, coupled to the first and second bandwidth modules, to transform the mapped data for transmission. In one embodiment, the first bandwidth module can process its first and second MIMO streams on a first frequency band, whereas the second bandwidth module can process its first and second MIMO streams on a second frequency band. The first and second frequency bands can be adjacent or non-adjacent.

The wireless transmitter can further include a module parser for parsing the received transmit data to the first and second bandwidth modules based on first and second frequency bands. The module parser is configured to parse based on a predetermined allocation scheme. In one embodiment, the predetermined allocation scheme allocates a first set of bits to the first bandwidth module and a second set of bits to the second bandwidth module, wherein the first and second sets of bits have equal distribution.

BRIEF DESCRIPTION OF THE DRAWINGS

Various embodiments of the invention will be better understood from a reading of the following detailed description, taken in conjunction with the accompanying drawings in which like reference characters designate like elements and in which:

FIGS. 6A, 6B, and 6C are exemplary diagrams illustrating encoding and frequency parsing in a consolidated fashion, with the interleaving function divided into two 80 MHz contiguous or non-contiguous bands, in accordance with an embodiment of the present invention; and FIGS. 7A and 7B are exemplary diagrams illustrating a modified data path performing encoding and interleaving in a divided fashion in each of the two halves of a full 160 MHz, in accordance with an embodiment of the present invention.

DETAILED DESCRIPTION OF THE DRAWINGS

Figure 1:
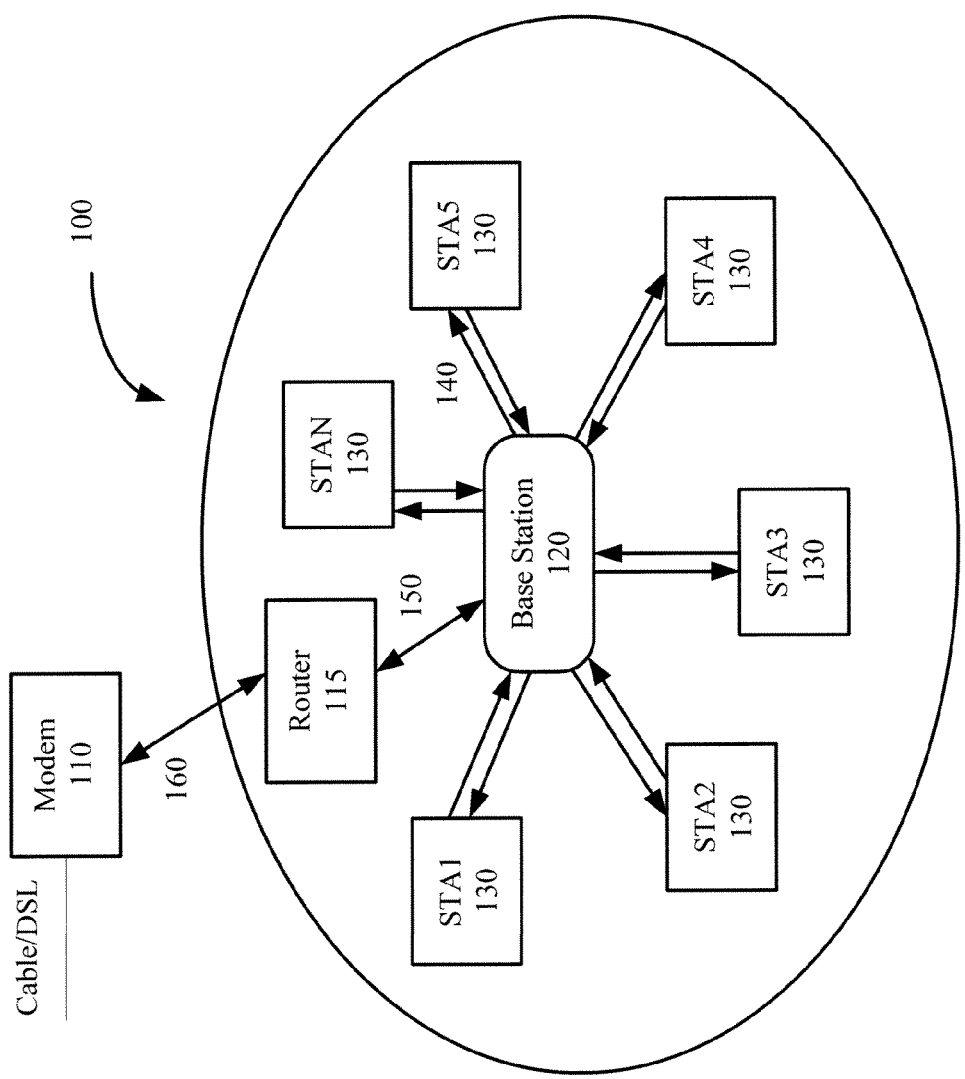
FIG. 1 is a typical wireless LAN based network in a home or small business.

Reference will now be made in detail to embodiments of the present invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing various embodiments of the invention are semi-diagrammatic and not to scale and, particularly, some of the dimensions are for the clarity of presentation and are shown exaggerated in the drawings. Similarly, although the views in the drawings for the ease of description generally show similar orientations, this depiction in the drawings is arbitrary for the most part. Generally, embodiments in accordance with the invention can be operated in any orientation.

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as " processing" or "accessing" or " executing" or " storing" or "rendering" or "receiving" or "producing" or "transforming" or "encoding" or "parsing" or "interleaving" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

Various embodiments of the invention can provide a solution to the increasing challenges inherent in wireless communications, such as with very high throughput available with the 802.11ac standard. Various embodiments of the present disclosure provide for the reuse of 80 MHz bandwidth modules in a 160 MHz bandwidth by dividing the 160 MHz bandwidth into an upper 80 MHz portion served by a first 80 MHz bandwidth module and a lower 80 MHz portion served by a second 80 MHz bandwidth module. Because subcarrier spacing is 312.5 kHz, the earlier 802.11a standard, with a 20 MHz bandwidth, can provide 64 possible tones, and the 802.11n standard with a 20/40 MHz bandwidth can provide either 64 or 128 possible tones. Therefore, the 802.11ac standard with an improved 20/40/80/160 MHz bandwidth can provide either 64, 128, 256 or 512 possible tones. Such an increase in the number of total possible tones will allow a data stream to be more widely interleaved. Interleaving across 512 tones provides an improved performance with a robust dispersion of the data to prevent unrecoverable errors. Various embodiments following the 802.11ac standard can involve, but are not limited to, an 80 MHz bandwidth, and optionally may also utilize a 160 MHz bandwidth. As described in detail below, two 80 MHz bandwidth modules can be used in parallel to cover a full 160 MHz bandwidth provided by the 802.11ac standard.

FIG. 1 illustrates a block diagram of a typical wireless LAN network 100. Various embodiments can be deployed at for example a home or business. Several users are represented by stations 130 among others. Stations 130 (STA1-STA5, in this embodiment) are capable of receiving and transmitting data from and to a base station 120. A wireless Access Point (AP) is one embodiment of the base station. The base station 120 communicates with a router 115 through a wire or wirelessly. The router 115 has network connectivity information on the network 100 and receives and forwards packets based on the source and destination addresses. A router 115 has a plurality of ports for connections and a single uplink port to connect to the rest of the internet through a cable modem 110, generally through a wire 160. A cable modem connects to the worldwide internet through a Cable Modem Termination System (CMTS) located in a central office of the service provider. Primarily, an embodiment deals with the wireless communication 140 between a station 130 and base station 120. The new 802.11ac VHT standard proposes to transport data at raw rates of up to 6.933 Gbps wirelessly and reliably over the air.

Figure 2:
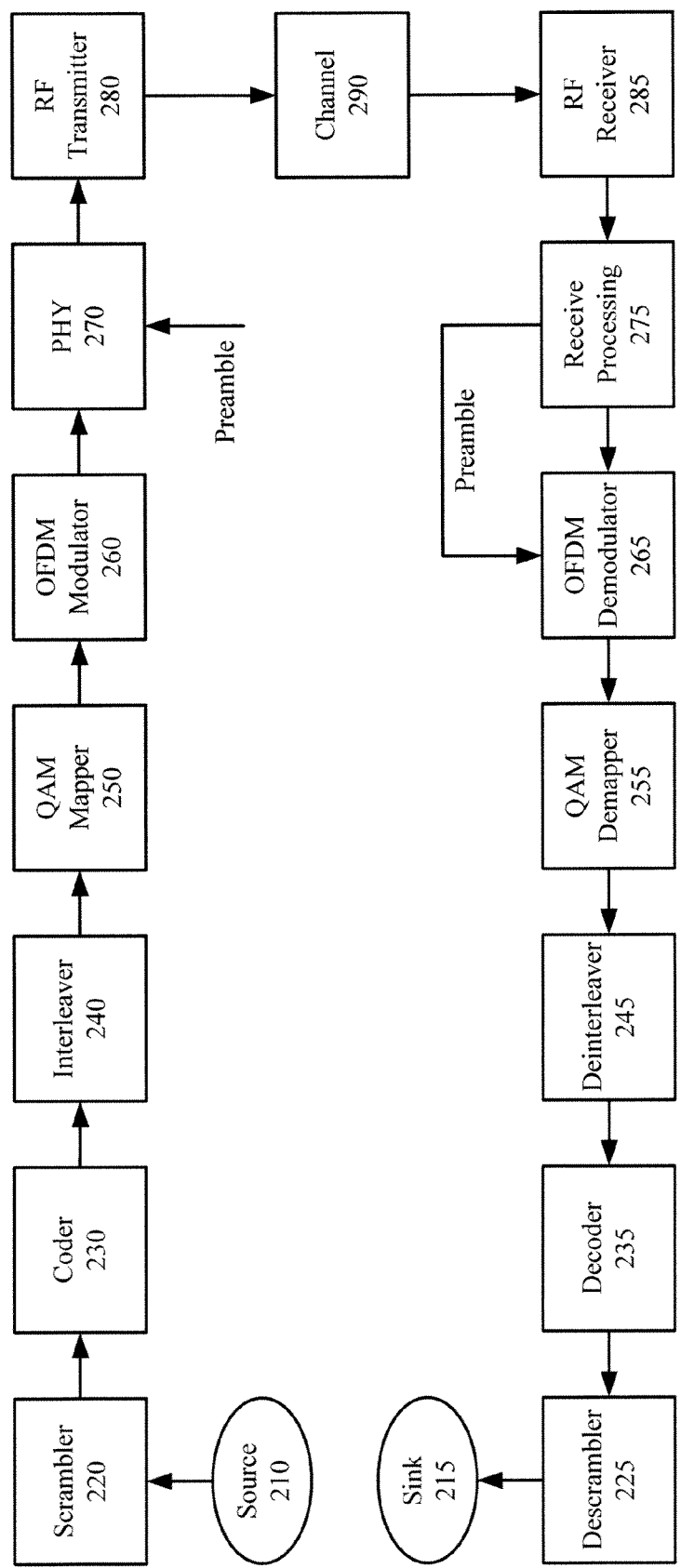
FIG. 2 is an exemplary high level block diagram of the physical layer implementation of a radio frequency transmitter and receiver showing major functions from a data link layer source to a data link layer sink and going through a wireless channel.

FIG. 2 illustrates the physical layer components of a transmitter and a receiver deployed in a station, access point or a router belonging to a wireless LAN network 105 of the type described in FIG. 1. Generally, packet data having all of the layer two functions (in accordance with the OSI communication model) and encapsulations is passed to the physical layer through a source 210. To provide for security as well as to have a balanced number of ones and zeroes (wherein a balanced number minimizes bias to the output signal), the packet data from the source 210 passes through a scrambler 220. The output of the scrambler 220 feeds into a coder 230, which encodes additional bits of information to be able to perform error detection and correction. To this point, the packet data based on layer two remains together. The error detection and correction function is effective where the number of errors in the block over which the encoding has been performed remains low. Where multiple errors do occur, which are not correctable by the use of forward error correction (FEC), the packet has to be dropped. Where a packet is part of a larger data stream on a certain application, the whole stream needs to be dropped and retransmitted. To reduce the packet error rate, it is architecturally preferred that the packet localized data be distributed in both time and frequency to reduce the probability of localized packet errors.

Such a distribution occurs through frequency interleaving and bit interleaving. In frequency interleaving, where data is carried over carrier buckets, the packetized data coming from layer two is distributed over a number of buckets. This distribution is not dependent on the respective packet source of the data. Similarly, in bit interleaving, the packet data from different packets are de-multiplexed to form a new stream with a mix of bits from a plurality of packets. In one embodiment, this function is achieved by an interleaver block 240. The interleaved data passes through a quadrature amplitude modulation (QAM) mapper 250, which maps the interleaved stream into a constellation of symbols. Such QAM mapped data passes through an orthogonal frequency domain modulator (OFDM), where the symbols from the QAM mapper are mapped onto carrier buckets in a certain band of operation. The output of the demodulator feeds into a PHY block 270, which inserts the preamble and performs additional processing on reception for channel estimation and frequency correction, among other things. The PHY block 270 feeds into a radio frequency (RF) transmitter 280 (which forms part of an RF transceiver) to be transmitted over channel 290.

Figure 3:
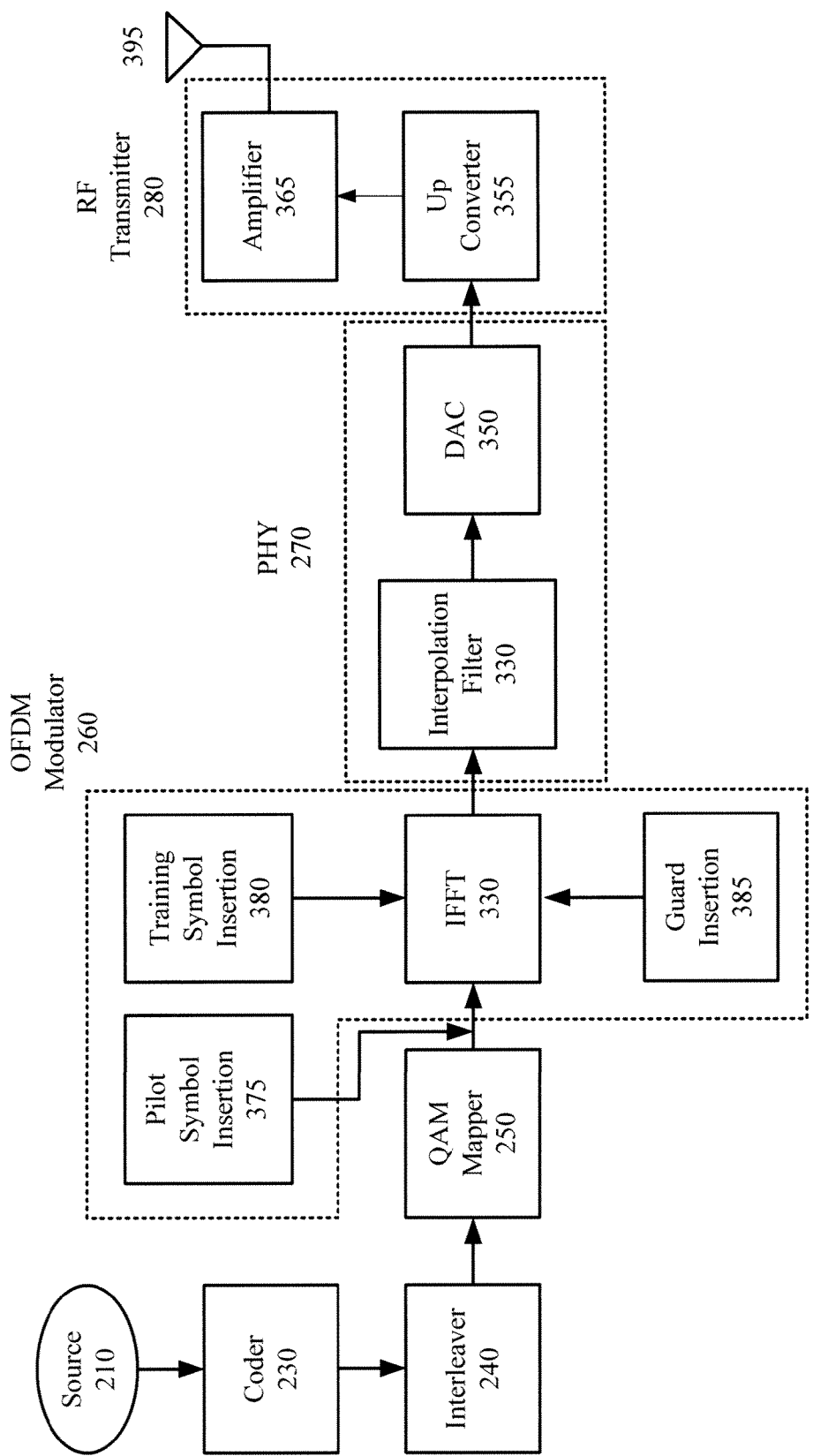
FIG. 3 is an exemplary diagram of an RF transmitter using quadrature amplitude modulation (QAM) and illustrating transmit physical layer with both digital and analog components.

On the receive side, based on the antenna targeted, the transmitted information is received into an RF receiver 285 (which forms part of an RF transceiver), where the preamble is separated from the data of the packet. The preamble is subject to additional receive processing in block 275 before the preamble and the data are passed to an OFDM demodulator 265. The OFDM demodulator 265 extracts bucket by bucket the distributed information into a stream of symbols to be fed to a QAM de-mapper 255. The QAM de-mapper 255 converts the symbols into a stream that is de-interleaved by block 245. The de-interleaved stream is then passed to a decoder 235 and a descrambler 225 before being passed to the data link layer of the node through a sink 215. Referring now also to FIG. 3, the transmitter path is described in further detail, with some components of the transmitter digital pipe and the analog components divided into their sub-components (some components of FIG. 2 are not shown for simplicity). The data link layer packetized source 210 feeds the data through the coder 230 and the interleaver 240 to the QAM mapper 250. The OFDM modulator 260 can add pilot symbols to the symbols generated by the QAM mapper 250 using a pilot symbol insertion block 375. The resulting symbols are provided to an inverse fast Fourier transform (IFFT) processor 330 where the guard and training symbol insertion (in the preamble) is provided by a training symbol insertion block 380 and a guard symbol insertion block 385 (wherein the OFDM modulator 260 can include the IFFT block 330, pilot symbol insertion block 375, training symbol insertion block 380, and the guard insertion block 385). The PHY block 270 can pass the IFFT block 330 output through an interpolation filter 340, consisting of an up-sampler and a filter. The output of the interpolation filer 330 is provided to a digital to analog converter 350 (wherein the PHY block 270 can include the interpolation filter 330 and the DAC 350). The RF transmitter 280 can up convert the intermediate frequency output of the DAC 350 using an up converter block 355 before being amplified by amplifier 365 (both forming part of the RF transmitter 280) and transmitted over an antenna 395.

Figure 4:
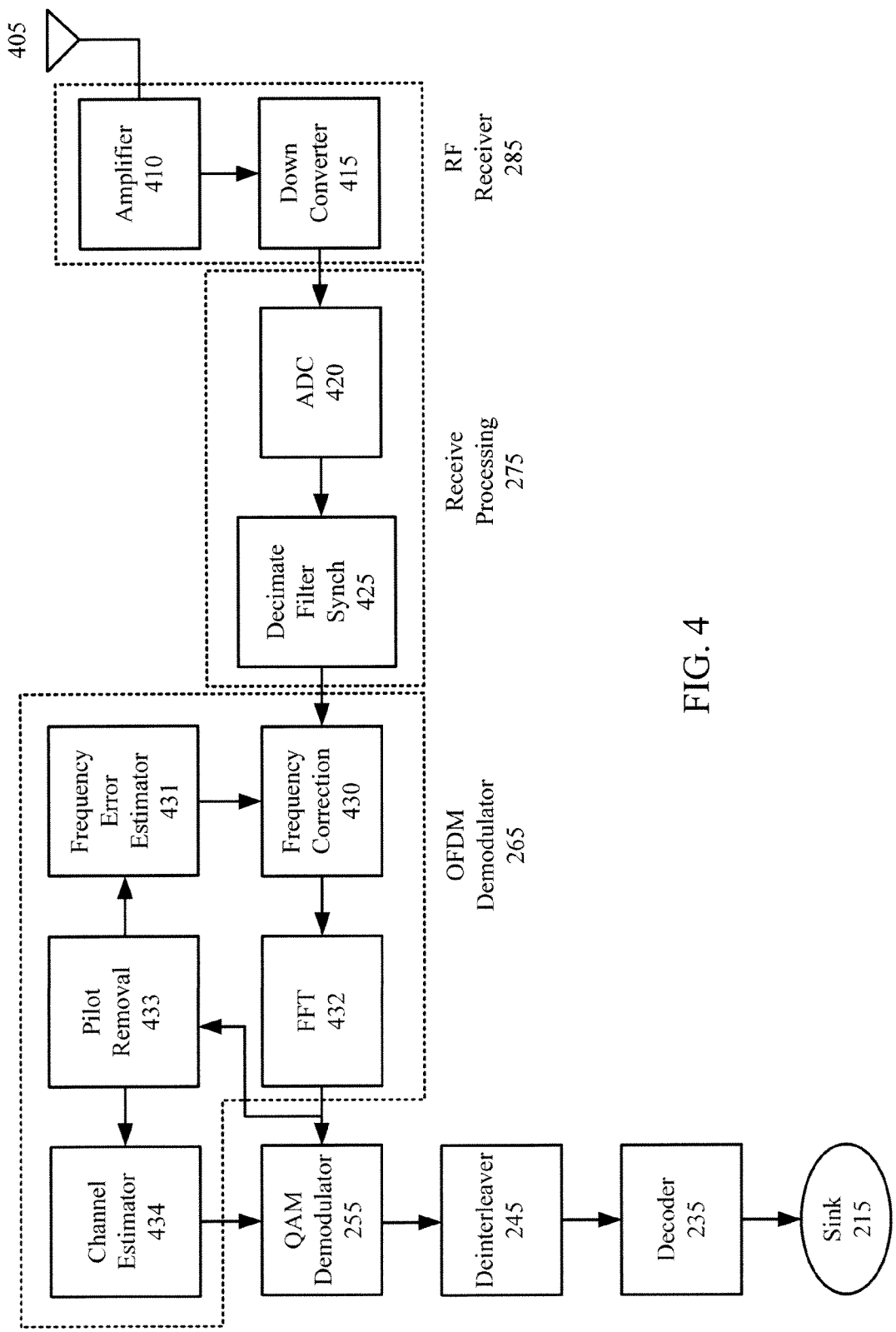
FIG. 4 is an exemplary diagram of the radio frequency (RF) receiver using quadrature amplitude de-modulator and illustrating receive physical layer with both digital and analog components.

Referring now also to FIG. 4, the receiver path is described in further detail, with some components of the receiver digital pipe and the analog components divided into their sub-components (some components of FIG. 2 are not shown for simplicity). The signal is received through an antenna 405 and is fed to the RF receiver 285, which includes an amplifier 410 for amplifying the received signal, and a down converter 415 for down converting the amplified signal to an intermediate frequency 515. The receive processing block 275 receives the output of down converter 415 and transforms the analog signal to a digital signal using an analog to digital converter (ADC) 420. The digital output from the ADC 420 is processed through a decimate filter synchronization block 425, which also forms part of receive processing block 275. The OFDM demodulator 265 receives the output of the decimate filter synchronization block 425. In this embodiment, OFDM modulator 265 can include a frequency correction block 430, a frequency error estimator 431, an FFT 432, a pilot removal block 433, and a channel estimator block 434. The frequency correction block 430 receives the output of the decimate filter synchronization block 425 as well as frequency error estimates from the frequency error estimator 431, which processes pilots (identified by pilot removal block 433, in part using outputs from an FFT block 432) in the preamble of the frames to perform frequency error estimation. The frequency-corrected signal is provided to an FFT block 432, which outputs its processed signal to the QAM demodulator 255. Channel estimator 434 also uses the identified pilots from the pilot removal block 433 to compute channel estimations, which are then also provided to the QAM demodulator 255. The output of the QAM demodulator 255 is fed to a de-interleaver 245 and the decoder 235 to pass the processed data to the sink 215, thereby signifying passage of packet data to the data link layer.

In an embodiment of the present invention, among other things, architectural tradeoffs are made in the delineation of functions and placement of the encoder 230, interleaver 240 and their receive counterparts, decoder 235 and de-interleaver 245.

Figure 5:
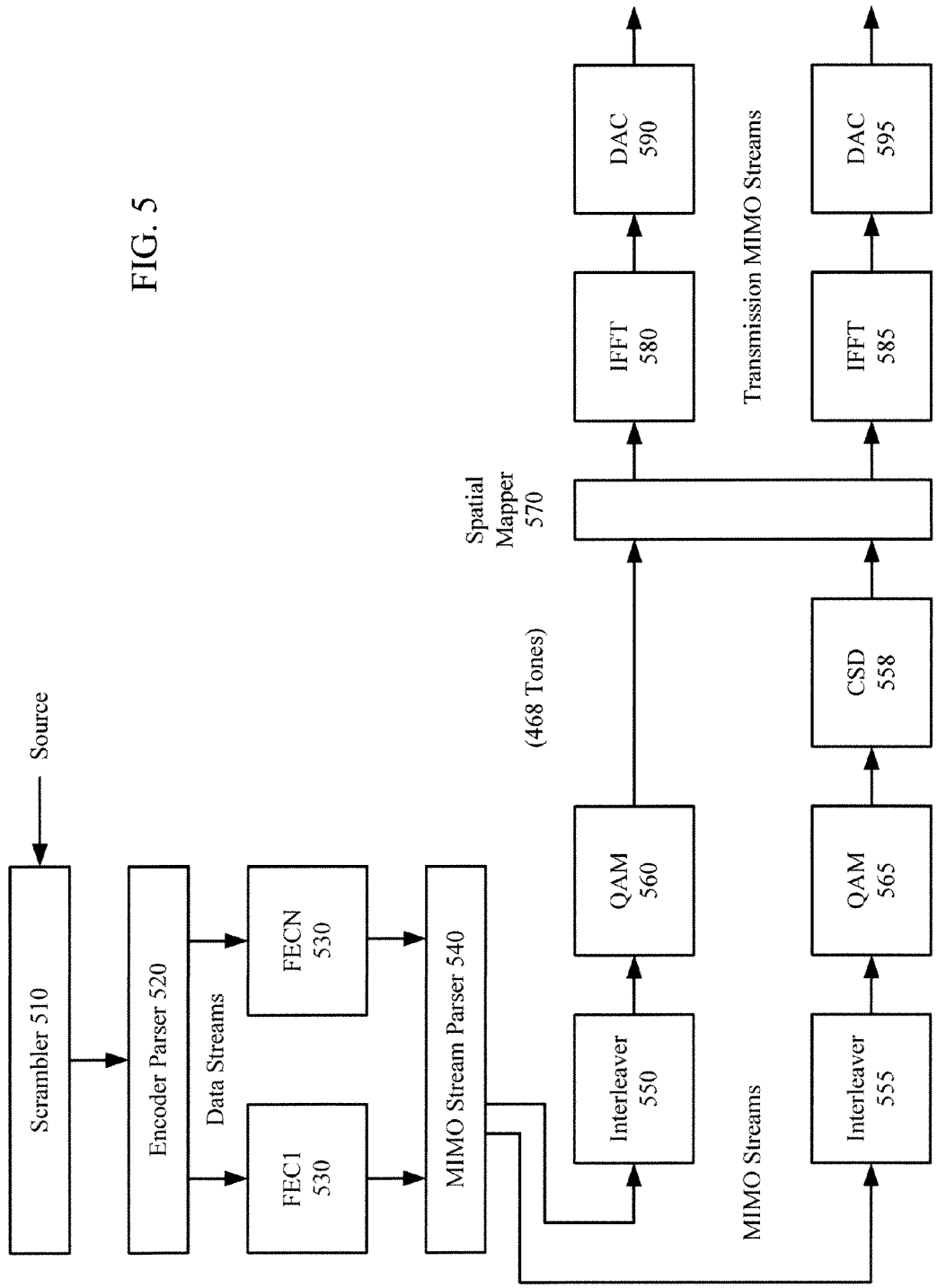
FIG. 5 is an exemplary diagram illustrating a full bandwidth transmit data path with encoding and interleaving occurring in a single block for the entire 160 MHz band, in accordance with an embodiment of the present invention.

FIG. 5 builds upon the transmit data path of FIG. 3 to provide a next generation transmit data path, designed for a wider band (e.g. 80 MHz to 160 MHz). The source of data in FIG. 5 may be the data link layer, which presents packet localized data. A scrambler 510 can scramble this data. The scrambled data stream is then parsed by an encoder parser 520 to divide the packetized data into modular elements over which a forward error correction (FEC) protocol can be executed by a plurality of FEC blocks 530. The encoder parser 520 may be used when some coding, such as a convolutional coding, may be desired. In some embodiments, the encoder parser 520 may be omitted when a Low Density Parity Check (LDPC) is employed elsewhere in the processing of the transmit data path. In one embodiment, the encoder parser 520 may parse an incoming data stream in a bit-wise or block wise round robin fashion.

The FEC blocks 530 may encode the stream of data with any common forward error correction coding. Typically such coding adds additional data (additional bits, in some cases) to allow a receiver to correct receive or transmission errors. In one embodiment, the entire effective data link layer is encoded across the complete bandwidth. The outputs of the FEC blocks 530 are streamed to a multiple-input multiple-output (MIMO) stream parser 540 to feed data into multiple, parallel MIMO streams for QAM mapping. In this embodiment, the MIMO stream parser 540 parses the data from the FEC blocks 530 into two MIMO streams. In other embodiments, the MIMO stream parser 540 may parse the stream into three or more MIMO streams. In yet other embodiments, the MIMO stream parser 540 may be bypassed when only one MIMO stream (i.e. one path of QAM mapping) is to be used. The number of MIMO streams in any particular embodiment may be a design choice. The MIMO stream parser 540 may parse bits in a round-robin bit-wise fashion. In alternative embodiments, the MIMO stream parser 540 may parse groups of bits in a round-robin fashion, or in any random or pseudo-random fashion.

The output of the MIMO stream parser 540 is coupled to interleaver blocks 550 and 555. Interleaver blocks 550 and 555 may use any well-known interleaving method. In one embodiment, an interleaver may be implemented with memory. Incoming data may be written into rows of the memory while outgoing data may be read out of columns of the memory. In one embodiment, data is interleaved across the entire band of interest. Interleavers 550, 555 may be coupled to QAM mappers 560 and 565, respectively. In some embodiments, the output of a QAM mapper may be coupled to a cyclic shift delayer (CSD), which may help prevent unintentional beamforming. In one typical embodiment, all MIMO streams, with the exception of one MIMO stream, include CSD blocks.

In FIG. 5, the two MIMO streams (one from QAM mapper 560 and one from CSD 558) are coupled to a spatial mapper 570. The spatial mapper 570 may determine how data from the QAM mapper 560 and the data from the CSD 558 are distributed to the transmission MIMO streams. In this embodiment, the spatial mapper 570 maps data to two transmission MIMO streams, which are coupled to IFFTs 580 and 585. The outputs of the IFFTs 580 and 585 are coupled to DACs 590 and 595, respectively. Note that when the transmission is to occur over two non-adjacent 80 MHz bands (e.g., non-contiguous transmission), then the output of the spatial mapper 570 may increase the number of transmission MIMO streams. For example, the two transmission MIMO streams shown in FIG. 5 may be split further into four transmission MIMO streams, with each transmission MIMO stream having a separate IFFT and DAC.

As configured in FIG. 5, a single flow data path is used for the entire exemplary 160 MHz band of operation. In this example, the implementation may use 468 tones (i.e., frequency bins) to cover 160 MHz (for example, 512 tones less 44 tones accounting for pilot, DC, and guard tones). As such, the interleavers 550 and 555 operate to interleave 468 tones and the IFFT may likewise operate on 512 tones spread over 160 MHz. Thus, as shown in FIG. 5, two streams may each be coded with 512 point IFFTs (580 and 585), each occupying the same frequency space. This solution is optimal for performance, as there is a natural match between the data path and the architectural requirements. Also, the entire 160 MHz bandwidth is available for frequency interleaving and bit interleaving. Due to more possibilities of interleaving in both bit and frequency dimension, the packet error rate can be low. This solution requires, however, that the hardware of the frequency domain functions run twice as fast as compared to other implementations because the data path must process all 468 tones. As more tones are provided, the data stream must be interleaved over a greater number of tones for a given time interval, requiring the system to run faster.

As noted above, the proposed IEEE 802.11ac standard requires an 80 MHz bandwidth, with a 160 MHz bandwidth optional. Therefore, a minimum 80 MHz bandwidth module is required for operation. In one exemplary embodiment, a pair of the 80 MHz bandwidth modules can be paired together to provide a 160 MHz bandwidth. An embodiment utilizing a pair of 80 MHz bandwidth modules, rather than a single 160 MHz module, may benefit from having each bandwidth module handle only 256 possible tones rather than the full 512 tones, thereby allowing for a slower clock speed. However, the interleavers in the 80 MHz bandwidth modules may only operate across half of the full 160 MHz bandwidth, which can reduce the performance of the device. Less interleaving can result in fewer opportunities to prevent unrecoverable errors. However, as discussed below, embodiments of the present invention provide a good tradeoff balance between performance and hardware complexity.

Figure 6A:
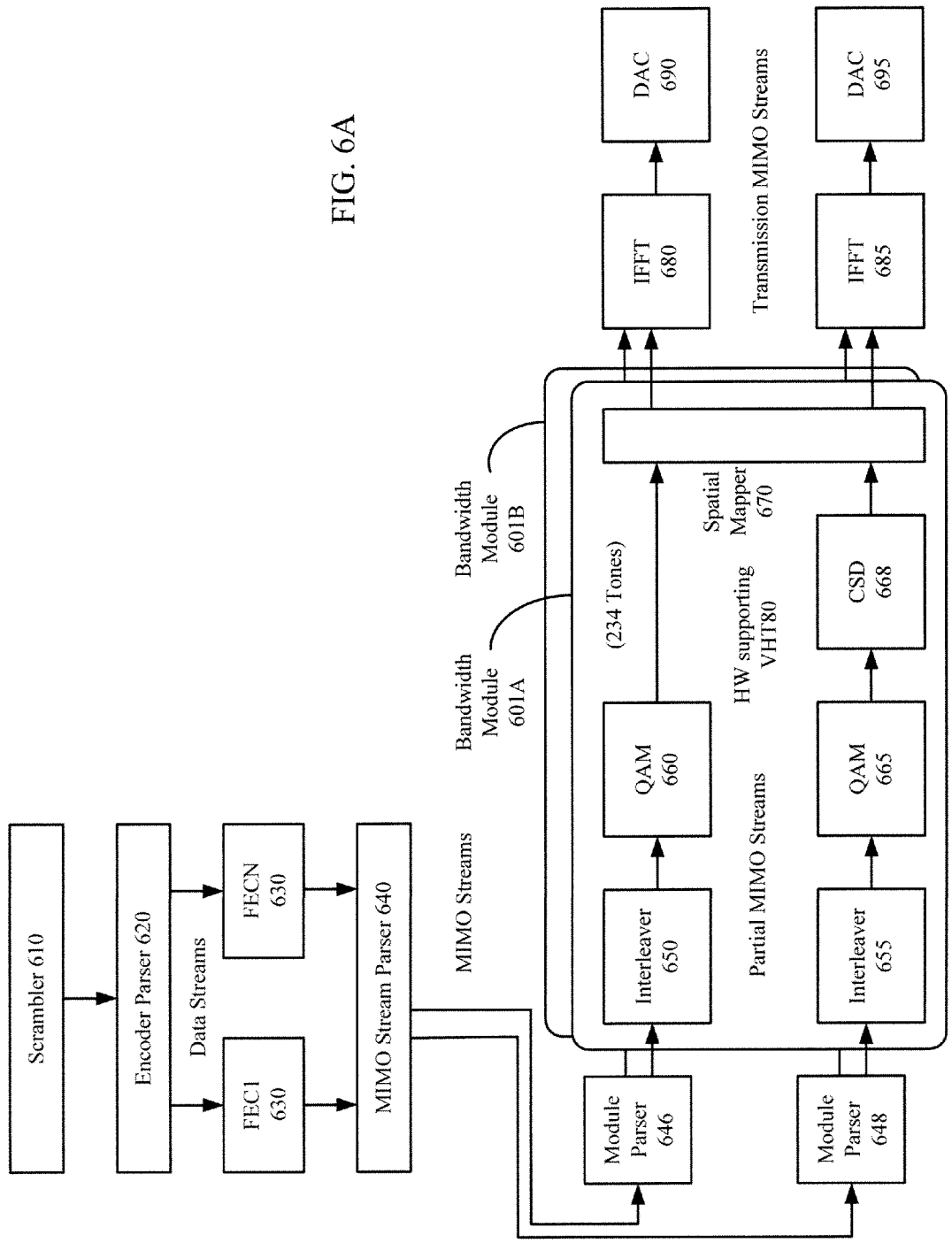

FIG. 6A illustrates an exemplary data path solution for 160 MHz bandwidth operation. Exemplary embodiments can transmit data over an entire 160 MHz bandwidth using two or more modules. By way of the example of FIG. 6A, data from the link layer is transmitted with two bandwidth modules 601A and 601B. The bandwidth modules 601A and 601B may be relatively similar and process data for the entire band of interest by splitting the processing work relatively evenly to both bandwidth modules.

The data from the data link layer is passed through a scrambler 610, an encoder parser 620, forward error correction blocks 630, and a stream parser 640. The encoder parser 620 may operate relatively similar to the encoder parser 520 (FIG. 5). In one embodiment, the MIMO stream parser 640 generates two MIMO streams that are provided to module parsers 646 and 648. The output bits of each module parser are allocated to the two bandwidth modules 601A and 601B in a predetermined manner. For example, the even bits may be allocated to a first bandwidth module 601A and the odd bits may be allocated to a second bandwidth module 601B, as shown in FIG. 6B. In other embodiments, for each stream, the module parser output bits are allocated to two bandwidth modules in a block-wise alternating fashion. In yet other embodiments, for each stream, the module parser output bits are allocated to two bandwidth modules in a random or pseudo-random fashion.

Thus, in this embodiment, module parsers 646 and 648 divide each MIMO stream into two partial MIMO streams, each processing a portion of the original frequency band. For example, an original 160 MHz stream may be split into two 80 MHz streams (each bandwidth module handling 80 MHz). Interleaving as provided by interleavers 650 and 655 may be as described for interleavers 550 and 555 (FIG. 5). In this embodiment, interleaving occurs within each bandwidth module. In addition to interleavers 650, 655, quadrature amplitude mappers 660, 665 and a cyclic shift delay 668 are also provided, along with the spatial mapper 670 in each of bandwidth modules 601A and 601B. Each of bandwidth modules 601A and 601B interfaces with IFFT blocks 680, 685, which in turn interface with DACs 690, 695. In one embodiment of FIG. 6, IFFTs 680, 685 and DACs 690, 695 may operate together to cover an entire frequency band of interest. Thus, both IFFTs cover the same band of interest. Although each of bandwidth modules 601A and 601B may only operate with half of the entire number of tones required to cover a band of interest (i.e., 234 tones), the tones from both bandwidth modules 601A and 601B may be combined by the IFFTs 680, 685 to cover the entire band of interest.

Note that in this configuration, each IFFT and DAC pair can support separate bands wherein each band may be non-adjacent or adjacent to its nearest band. Thus, the spatial mappers 670 may be modified such that partial MIMO streams may be mapped into particular frequency bands. For example, if a 512 point IFFT is replaced by two 256 point IFFTs, then essentially two independent frequency bands may be transmitted. Following this example, if the 512 point IFFT serviced 160 MHz, then two 256 IFFTs may service two 80 MHz bands. These bands need not be adjacent to each other in frequency. Furthermore, each band may use an independent modulation scheme from the other.

As noted above, the configuration of FIG. 6A allows coding by the FEC 630s to code over the entire band of interest. Interleaving, on the other hand, is only spread over a portion of the band of interest by way of the bandwidth modules. In FIG. 6A, interleavers 650 and 655 operate over a first portion of the band of interest, while corresponding interleaver blocks in the bandwidth module 601B operate over a second portion of the band of interest.

The design approach shown in FIG. 6A may have reduced design risks since lower clock speeds may be required by virtue of splitting work across two or more bandwidth modules. It can be appreciated that the encoding in this embodiment of the invention occurs outside of the replicated modules and hence across the entire band. Therefore, the ability to detect and correct errors remains robust as the data stream is distributed to the replicated paths after encoding, maintaining almost the same number of redundant bits and frequency interleaving possibilities as the solution of FIG. 5. Simulation results have shown some degradation in performance, but for the packet error rate to be within 10% of the solution in FIG. 5, only 0.2 decibels of additional signal to noise ratio is required for the embodiment illustrated in FIG. 6A. In this embodiment of the present invention, nearly as good a performance as from FIG. 5 (full data path design for 160 MHz bandwidth) is obtained along with the ability to share components from previous design cycles, reducing time to market and making possible the avoidance of a design and verification cycle.

Although FIG. 6A shows only two bandwidth modules 601A and 601B, other embodiments may use three or more bandwidth modules. Interleaving still only occurs within each bandwidth module, but since coding by FEC modules occurs upstream of bandwidth modules, coding still is spread across the entire band of interest. Furthermore, although FIG. 6A shows the case of two bandwidth modules supporting identical bandwidths, other embodiments may use bandwidth modules where each bandwidth module supports different bandwidths.

Figure 6C:
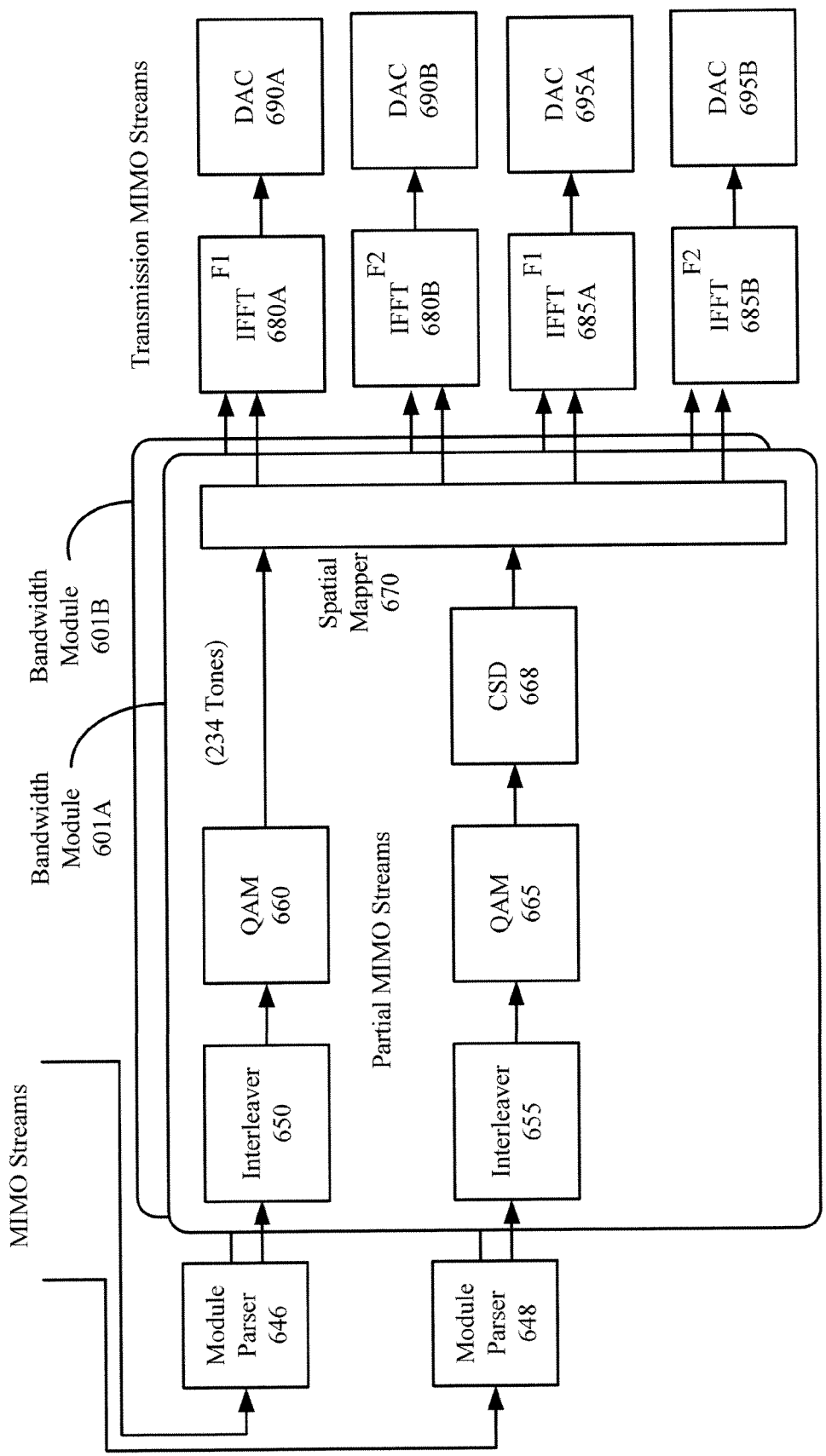

Note that the entire frequency band of interest may not be continuous. That is, the frequency band that may be selected for transmission may be comprised of separate, non-adjacent frequency bands. To support this configuration, additional IFFTs and corresponding DACs can be included, as shown in FIG. 6C. For example, IFFTs 680, 685 and DACs 690, 695 can be replaced by IFFTs 680A, 680B, 685A, 685B and DACs 685A, 685B, 695A, 695B. In one embodiment, the IFFTs 680A, 680B, 685A, 685B can receive independent outputs from the spatial mappers 670 in bandwidth modules 601A and 601B. Moreover, IFFTs 680A, 685A can be 262 point IFFTs directed to frequency band F1, whereas IFFTs 680B and 685B can be 262 point IFFTs directed to frequency band F2. Note that although four IFFTs and DACs are shown, any even number of IFFTs/DACs can be used to process half the number of frequency bands (e.g. 4 IFFTs/DACs for 2 frequency bands, 6 IFFTs/DACs for 3 frequency bands, etc.). In one embodiment, the frequency bands are not the same bandwidth, e.g. one set of the frequency bands could be directed to 40 MHz and another set of the frequency bands could be directed to 20 MHz (thereby not using the full 160 MHz bandwidth).

Figure 7A:
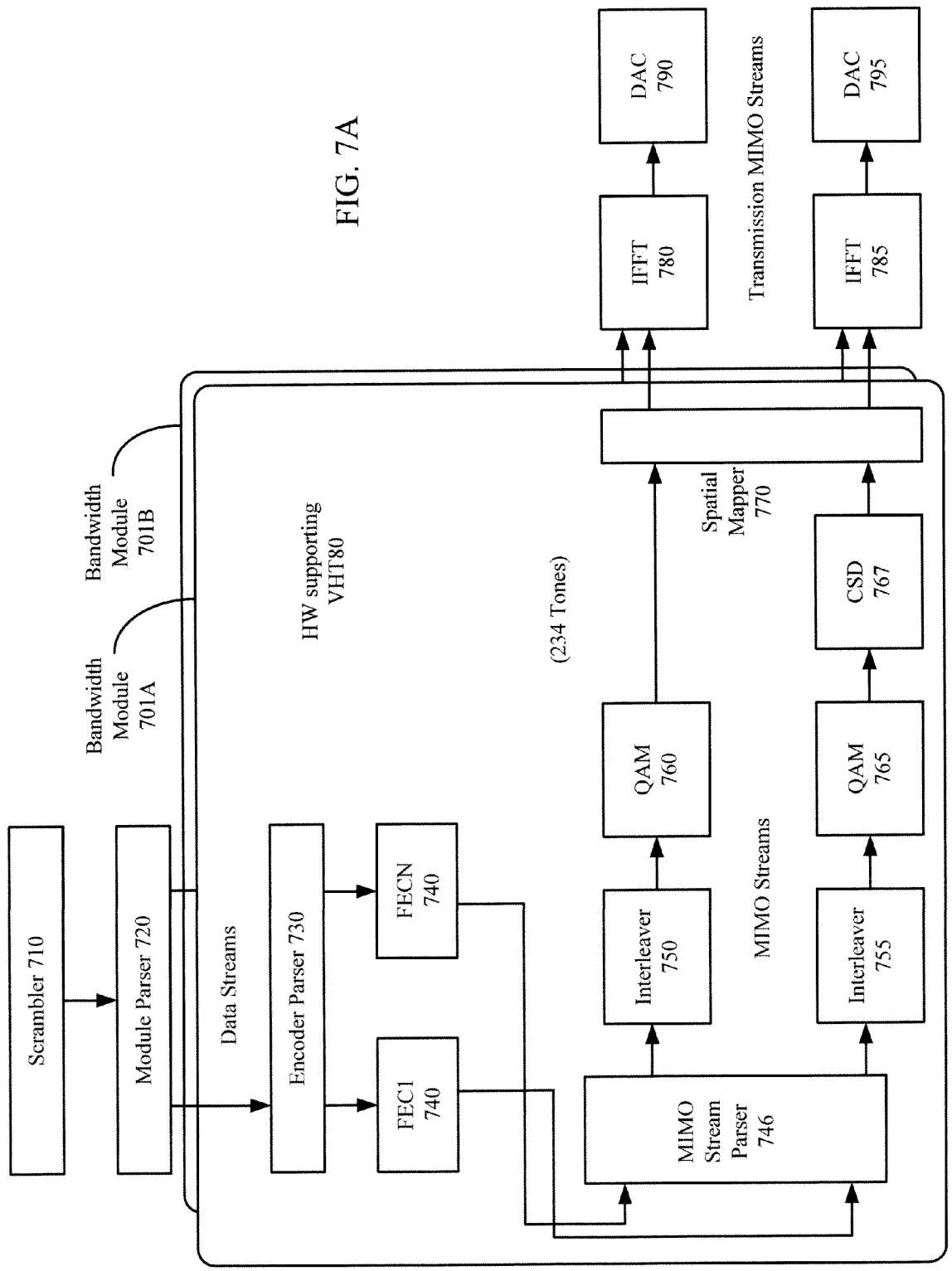

FIG. 7A illustrates another exemplary embodiment of the present invention. The data link layer traffic is passed through a scrambler 710. In this case, however, the next block is the module parser 720 that splits the data stream into two streams prior to the encoding function performed by a encoder parser 730, which occurs in both bandwidth modules 701A and 701B. The module parser 720 may function similarly to the module parsers 646 and 648 (FIG. 6B), as shown in FIG. 7B. In contrast to FIG. 6A, each of the bandwidth modules 701A and 701B includes an encoder parser 730 and an FEC 740. After encoding by encoder parser 730 and FEC 740, a stream parser 746 can create a plurality of MIMO streams. In the embodiment of FIG. 7A, interleavers 750, 755, QAMs 760, 765, and CSD 767 can process the two MIMO streams in each of bandwidth modules 701A and 701B. A spatial mapper 770 can combine the two MIMO streams and then map the resulting stream into an appropriate number of transmission MIMO streams. IFFTs 780, 785 and DACs 790, 795 can process the combined MIMO streams from bandwidth modules 701A, 701B.

As shown in FIG. 7A, the IFFTs 780, 785 may operate on 512 tones similar to the IFFTs described in FIG. 6. Similar to the configuration described for FIG. 6C, the data from the spatial mapper 770 may be mapped to two or more adjacent or non-adjacent frequency bands by replacing, for example, an IFFT with two or more IFFT blocks (and corresponding DACs). For example, if 512 point IFFT 780 is replaced with two 256 point IFFTs, then the streams could be mapped to the 256 point IFFTs wherein each IFFT (and corresponding DAC) may process data for a frequency band. Since each IFFT is independent, the frequency bands can also be independent (i.e. the frequency bands need not be adjacent). Furthermore, signals transmitted on independent frequency bands may be independently encoded with different modulate and coding scheme (MCS).

The data stream in this exemplary design is frequency parsed before encoding. Therefore, a degree of mix within each replicated data path is limited. Encoding and interleaving occur substantially within each bandwidth module. Accordingly, a packet error rate (PER) for the embodiment in FIG. 7A may be higher than a packet error rate (PER) for the embodiments in FIG. 5 and FIG. 6A. Simulation results done under similar conditions to the simulations done for the embodiment of FIG. 6A may establish this. Whereas the solution of FIG. 6A may require only 0.2 dB of additional signal to noise ratio to be within 10% of the packet error rate of the exemplary embodiment illustrated in FIG. 5, the exemplary embodiment illustrated in FIG. 7A may require an improvement in the signal to noise ratio of 1-1.5 dB for some of the modulation and coding schemes. However, the scheme of FIG. 7A has an advantage of sharing the encoding function within the bandwidth module.

Other embodiments of FIG. 7A may include three or more bandwidth modules. In addition, other embodiments of FIG. 7A may support bandwidth modules in which each bandwidth module may support different bandwidths.

It can be noted by artisans skilled in the art that whereas this solution of delineating coding and interleaving functions on a transmit data path has been shown for a wireless LAN application, the same solution or an embodiment of the present invention may be similarly applied to other forms of QAM applications. These include point to point QAM applications with 16, 32, 64, 128 and 256 constellations. Other applications include but are not restricted to a digital video transmitter and receiver with 16, 32 or 64 QAM and cable TV with 16, 64 and 256 QAM.

It can also be appreciated that while a transmitter has been proposed in detail, through description and illustration of FIGS. 5, 6A, 6B, 7A, 7B, a similar and a symmetric scheme applies to the receive path, with blocks replaced with their corresponding blocks from the receive pipe illustrated in FIG. 4. For the communication to work in each of the three schemes, the receive path is analogous as regards to there being no replication, replication with decoding, and replication without decoding. This is exactly similar to the transmit path. Architecturally, those skilled in the art can recognize that the design of the transmitter also controls the design of the receiver.

An embodiment of the present invention includes a complete data link source to data link sink system path as illustrated in FIG. 1, with portions of the receiver and transmitter functionally specified in accordance with FIGS. 5, 6A, 6B, and FIGS. 7A, 7B for the transmitter and analogous functions for the receiver. In one embodiment of the present invention, the solution of FIG. 6A is a preferred embodiment of the design.

Although certain embodiments have been disclosed herein, it will be apparent from the foregoing disclosure to those skilled in the art that variations and modifications of such embodiments may be made without departing from the spirit and scope of the invention. It is intended that the invention shall be limited only to the extent required by the appended claims and the rules and principles of applicable law.

The invention claimed is:

1. A wireless transmitter comprising:
    encoding components receiving transmit data and generating encoded data;
    a MIMO stream parser receiving the encoded data and generating a plurality of multiple-input multiple-output (MIMO) streams;
    a first module parser coupled to receive a first MIMO stream of the plurality of MIMO streams, and in response, generate a first plurality of partial MIMO streams;
    a first bandwidth module coupled to receive a first partial MIMO stream of the first plurality of partial MIMO streams, the first bandwidth module including a first interleaver that interleaves bits of the first partial MIMO stream and generates first interleaved data;
    a second bandwidth module coupled to receive a second partial MIMO stream of the first plurality of partial MIMO streams, the second bandwidth module including a second interleaver that interleaves bits of the second partial MIMO stream and generates second interleaved data; and
    a first inverse fast Fourier transform (IFFT) unit coupled to the first and second bandwidth modules to combine and process the first and second interleaved data and to generate a first transmission MIMO stream.

2. The wireless transmitter of claim 1, wherein the first and second partial MIMO streams are processed on adjacent frequency bands.

3. The wireless transmitter of claim 1, wherein the first and second partial MIMO streams are processed on non-adjacent frequency bands.

4. The wireless transmitter of claim 1, wherein the first and second interleavers interleave the bits of the first and second partial MIMO streams, respectively, over different frequency bands.

5. The wireless transmitter of claim 1, wherein the first module parser allocates even bits of the first MIMO stream to the first partial MIMO stream for the first bandwidth module and odd bits of the first MIMO stream to the second partial MIMO stream for the second bandwidth module.

6. The wireless transmitter of claim 5, further comprising:
    a second module parser coupled to receive a second MIMO stream of the plurality of MIMO streams, and in response, generate a second plurality of partial MIMO streams, the first and second module parsers providing a same allocation of bits to the first and second bandwidth modules,
        the first bandwidth module coupled to receive a third partial MIMO stream of the second plurality of partial MIMO streams, the first bandwidth module including a third interleaver that interleaves bits of the third partial MIMO stream and generates third interleaved data, and
        the second bandwidth module coupled to receive a fourth partial MIMO stream of the second plurality of partial MIMO streams, the second bandwidth module including a fourth interleaver that interleaves bits of the fourth partial MIMO stream and generates fourth interleaved data; and
a second IFFT unit coupled to the first and second bandwidth modules to combine and process the third and fourth interleaved data to generate a second transmission MIMO stream.

7. The wireless transmitter of claim 6, wherein the first and second IFFT units each provide for a 160 MHz bandwidth.

8. The wireless transmitter of claim 6, further including first and second spatial mappers in the first and second bandwidth modules, respectively, each of the first and second spatial mappers receiving modulated, interleaved data and mapping tones to the first and second IFFTs.

9. The wireless transmitter of claim 8, wherein each of the first and second spatial mappers performs mapping over 234 tones.

10. A wireless transmitter comprising:
a module parser receiving transmit data and producing first and second data streams from the transmit data;
a first bandwidth module coupled to receive the first data stream, the first bandwidth module comprising:
first encoding components receiving the first data stream and generating first encoded data;
a first multiple-input multiple-output (MIMO) stream parser receiving the first encoded data and generating a first plurality of MIMO streams;
a first interleaver coupled to the first MIMO stream parser, wherein the first interleaver provides first interleaved bits in response to a first one of the first plurality of MIMO streams; and
a first spatial mapper, coupled to the first interleaver, wherein the first spatial mapper provides first mapped data in response to the first interleaved bits;
a second bandwidth module coupled to receive the second data stream, the second bandwidth module comprising:
second encoding components receiving the second data stream and generating second encoded data;
a second MIMO stream parser receiving the second encoded data and generating a second plurality of MIMO streams; and
a second interleaver coupled to the second MIMO stream parser, wherein the second interleaver provides second interleaved bits in response to a first one of the second plurality of MIMO streams; and
a second spatial mapper coupled to the second interleaver, wherein the second spatial mapper provides second mapped data in response to the second interleaved bits; and
a first inverse fast Fourier transform (IFFT) unit coupled to receive the first mapped data from the first spatial mapper and the second mapped data from the second spatial mapper, and in response, provide a first transmit MIMO stream.

11. The wireless transmitter of claim 10, wherein the first and second data streams are processed on adjacent frequency bands.

12. The wireless transmitter of claim 10, wherein the first and second data streams are processed on non-adjacent frequency bands.

13. The wireless transmitter of claim 10, wherein the first and second interleavers interleave bits of the first and second data streams, respectively, over different frequency bands.

14. The wireless transmitter of claim 10, wherein the module parser allocates even bits of the transmit data to the first data stream and odd bits of the transmit data to the second data stream.

15. The wireless transmitter of claim 10, wherein the first bandwidth module further comprises a third interleaver coupled to the first MIMO stream parser, wherein the third interleaver provides third interleaved bits in response to a second one of the first plurality of MIMO streams, and wherein the first spatial mapper provides third mapped data in response to the third interleaved bits
the second bandwidth module further comprises a fourth interleaver coupled to the second MIMO stream parser, wherein the fourth interleaver provides fourth interleaved bits in response to a second one of the second plurality of MIMO streams, and wherein the second spatial mapper provides fourth mapped data in response to the fourth interleaved bits; and
a second IFFT unit coupled to receive the third mapped data from the first spatial mapper and the fourth mapped data from the second spatial mapper, and in response, provide a second transmit MIMO stream.

16. A wireless transmitter comprising:
a first bandwidth module that performs processing over a first portion of a first frequency band;
a second bandwidth module that performs processing over a second portion of the first frequency band;
each of the first and second bandwidth modules being configured to:
receive a plurality of partial multiple-input multiple-output (MIMO) streams including encoded transmit data;
interleave bits of the plurality of partial MIMO streams to generate interleaved data;
modulate the interleaved data to generate modulated data; and
perform spatial mapping on the modulated data based on predetermined tones to generate mapped data; and
a first inverse fast Fourier transform (IFFT) unit coupled to the first and second bandwidth modules, wherein the first IFFT unit combines mapped data from the first and second bandwidth modules to provide a transmit MIMO stream that covers the entire first frequency band.

17. The wireless transmitter of claim 16, wherein the first and second bandwidth modules process the partial MIMO streams on adjacent frequency bands.

18. The wireless transmitter of claim 16, wherein the first and second bandwidth modules process the partial MIMO streams on non-adjacent frequency bands.

19. The wireless transmitter of claim 16, further including:
a MIMO stream parser receiving a plurality of encoded data streams and generating a plurality of MIMO streams; and
a plurality of module parsers, each module parser receiving a MIMO stream and allocating bits of the MIMO stream to the first and second bandwidth modules based on a predetermined allocation scheme.

20. The wireless transmitter of claim 19, wherein the predetermined allocation scheme allocates even bits to the first bandwidth module and odd bits to the second bandwidth module.

21. The wireless transmitter of claim 16, wherein the spatial mapping uses 234 tones for the predetermined tones.

22. A wireless transmitter comprising:
a first bandwith module;
a second bandwith module;
each of the first and second bandwith modules being configured to:

encode received transmit data to generate encoded data;
parse the encoded data into first and second multiple-input multiple-output (MIMO) streams;
interleave bits from each of the first and second MIMO streams to generate interleaved bits;
modulate the interleaved bits to generate modulated data; and
perform spatial mapping on the modulated data based on predetermined tones to generate mapped data; and first and second inverse fast fourier transform (IFFT) units, each coupled to both the first and second bandwidth modules to transform the mapped data for transmission.

23. The wireless transmitter of claim 22, wherein the first bandwidth module processes its first and second MIMO streams on a first frequency band, the second bandwidth module processes its first and second MIMO streams on a second frequency band, the first and second frequency bands being adjacent.

24. The wireless transmitter of claim 22, wherein the first bandwidth module processes its first and second MIMO streams on a first frequency band, the second bandwidth module processes its first and second MIMO streams on a second frequency band, the first and second frequency bands not being adjacent.

25. The wireless transmitter of claim 22, further including:
a module parser for parsing the received transmit data to the first and second bandwidth modules based on predetermined frequency bands.

26. The wireless transmitter of claim 25, wherein the module parser is configured to parse based on a predetermined allocation scheme.

27. The wireless transmitter of claim 26, wherein the predetermined allocation scheme allocates a first set of bits to the first bandwidth module and a second set of bits to the second bandwidth module, the first and second sets of bits having equal distribution.

28. The wireless transmitter of claim 22, wherein the spatial mapping uses 234 tones for the predetermined tones.

29. The wireless transmitter of claim 10, wherein the first spatial mapper uses a first set of tones associated with a first frequency band to generate the first mapped data, the second spatial mapper uses a second set of tones associated with a second frequency band, different than the first frequency band, to generate the second mapped data, and the first IFFT unit generates the first transmit MIMO stream in response to both the first and second sets of tones.

* * * * *